(12) United States Patent
Yu

(10) Patent No.: US 6,893,283 B2
(45) Date of Patent: May 17, 2005

(54) ZERO INSERTION FORCE ELECTRICAL CONNECTOR WITH RELIABLE ACTUATION MEMBER

(75) Inventor: Wei Yu, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/839,838

(22) Filed: May 5, 2004

(65) Prior Publication Data

US 2004/0224549 A1 Nov. 11, 2004

(30) Foreign Application Priority Data

May 5, 2003 (TW) ..................................... 92208189 U

(51) Int. Cl.⁷ ............................................... H01R 4/50
(52) U.S. Cl. ..................................................... 439/342
(58) Field of Search ................................ 439/342, 259, 439/261–266, 268–270, 70, 71

(56) References Cited

U.S. PATENT DOCUMENTS

| 6,280,223 | B1 | 8/2001 | Lin |
|---|---|---|---|
| 6,406,317 | B1 | 6/2002 | Li et al. |
| 6,482,022 | B2 | 11/2002 | Trout et al. |
| 6,508,659 | B1 | 1/2003 | Howell et al. |
| 6,533,597 | B1 | 3/2003 | Wang et al. |
| 6,544,065 | B1 | 4/2003 | Howell et al. |
| 6,676,418 | B2 * | 1/2004 | Watanabe .................... 439/342 |
| 2004/0224548 | A1 * | 11/2004 | Yu .............................. 439/342 |
| 2004/0242047 | A1 * | 12/2004 | Nguyen ....................... 439/342 |

* cited by examiner

Primary Examiner—Tho D. Ta
Assistant Examiner—Felix O. Figueroa
(74) Attorney, Agent, or Firm—Wei Te Chung

(57) ABSTRACT

A zero insertion force (ZIF) electrical connector (1) includes a base (2) forming an arcuate surface (216) at an end thereof, a cover (3) mounted on the base and defining an opening (32) in an end thereof, and an actuation member (4) for actuating the cover to slide along the base. The actuation member includes a driving shaft (40) located between the cover and the base and forming a cam (403) at an end thereof engaging in the opening of the cover, a coil spring (41) attached around an end of the driving shaft, and an operating lever (42) assembled to the end of the driving shaft. The operating lever defines a cutoff to forming an engaging surface (422). When the engaging surface abutting against the arcuate surface of the base, the operating lever can rotates automatically to a desired position under compression of the coil spring.

13 Claims, 5 Drawing Sheets

ZERO INSERTION FORCE ELECTRICAL CONNECTOR WITH RELIABLE ACTUATION MEMBER

BACKGROUND OF THE INVENTION

1. Field of the Invention

The present invention relates to a zero insertion force (ZIF) electrical connector, and particularly to a ZIF electrical connector for electrically connecting an electronic package such as a central processing unit (CPU) with a circuit substrate such as a printed circuit board (PCB).

2. Description of the Prior Art

Zero insertion force (ZIF) electrical connectors are well known in the computer industry and used for electrically connecting electronic packages such as central processing units (CPUs) with circuit substrates such as printed circuit boards (PCBs). Pertinent examples of such connectors are disclosed in U.S. Pat. Nos. 6,544,065, 6,533,597, 6,508,659, 6,482,022, 6,406,317 and 6,280,223.

Normally, a conventional ZIF electrical connector comprises an insulative base mounted on a PCB, a cover movably mounted on the base, and an actuation member. The base defines a multiplicity of vertical passageways therethrough, and a T-shaped recess in a front end thereof. The passageways receive a corresponding number of electrical contacts therein respectively, and each passageway has a receiving space adjacent a corresponding contact. A hook is formed on the base adjacent to the recess. The cover defines a multiplicity of passages therethrough. The actuation member is accommodated in the recess, and comprises a driving shaft arranged between the base and the cover, and an operating lever extending perpendicularly from an end of the driving shaft. The operating lever can be operated between a first position and a second position, thereby the driving shaft moving the cover with respect to the base. When the operating lever is located at the first position, the passages of the cover are disposed over corresponding receiving spaces of the base, and pins of a CPU can plug through the passages of the cover into the receiving spaces of the base with ZIF. The operating lever is then rotated to the second position, and the hook catches an end portion of the operating lever. The cover pushes the pins of the CPU into corresponding contacts, thereby the connector electrically connecting the CPU with the PCB. Conversely, when the operating lever is rotated to the first position, the CPU can be detached from the connector with ZIF.

In the above-described connector, the operating lever is usually rotated to the first position by means of manual operation. If a force of rotating the operating lever is insufficient, the operating lever is driven only part of the way toward the first position. When the CPU is then attached/detached onto/from the connector, the pins of the CPU interfere with the contacts. The pins and the contacts are thus liable to sustain damage. As a result, the electrical connection between the CPU and the PCB is disrupted or may even fail altogether.

Therefore, it is a need for reliable rotating the operating lever to the first position. To this end, a spring is assembled onto the operating lever to automatically drive the operating lever to rotate to the first position. The spring has a first end attached to the base in the recess, and a second end fastened on the operating lever. When the operating lever is located the second position, the second end of the coil spring is rotated under forces from the operating lever, with the spring undergoing steadily increasing tension during such rotation. Accordingly, the operating lever can automatically rotate to the first position, as soon as being released from the hook, and not in any intermediate position. In this state, the pins of the CPU can reliably insert/remove into/from the passageways with ZIF. However, in use of the connector, the operating lever is oriented at the second position at all time. The spring undergoes the tension, and the operating lever stands contrary force from the spring. At the same time, the hook endures compression from the operating lever. Generally, the hook is made of insulative material such as plastic. Thus, the hook is liable to be broken when the hook bears the force for a long time. When this happens, the operating lever automatically rotates to the first position. Electrical connection between the CPU and the PCB is disrupted.

In view of the above, a new ZIF electrical connector that overcomes the above-mentioned disadvantages is desired.

SUMMARY OF THE INVENTION

Accordingly, an object of the present invention is to provide a zero insertion force (ZIF) electrical connector for electrically connecting an electronic package such as a central processing unit (CPU) with a circuit substrate such as a printed circuit board (PCB), wherein the connector has a configured actuation member rotating reliably automatically to a desired position, in which the CPU can be assembled/detached onto/from the connector with ZIF, and safely oriented at a second position, in which the CPU can be electrically connected with the PCB.

To achieve the above object, a ZIF electrical connector in accordance with a preferred embodiment of the present invention comprises an insulative base mounted onto a circuit substrate such as a printed circuit board (PCB), a cover movably mounted onto the base, and an actuation member located between the cover and the base to move the cover with respect to the base. The base defines a T-shaped chamber in an end thereof, and having a baffle at the end thereof. The baffle defines an arcuate surface facing the chamber. The cover defines an opening in an end thereof The actuation member comprises a driving shaft located in the chamber, a coil spring attached around an end of the driving shaft, and an operating lever engaging the end of the driving shaft. The driving shaft has a cam at opposition end thereof, the cam engaging in the opening of the cover to move the cover when the driving shaft rotating. An end of the coil spring is engaging with the driving shaft, and an opposite end of the coil spring is moveably engaging with an end of the operating lever. The operating lever defines a cutout thereby forming an engaging surface. When the operating lever is orated, the engaging surface abuts against the arcuate surface of the baffle of the base. The operating lever can automatically rotate to a desire position under compression of the coil spring.

Other objects, advantages and novel features of the present invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
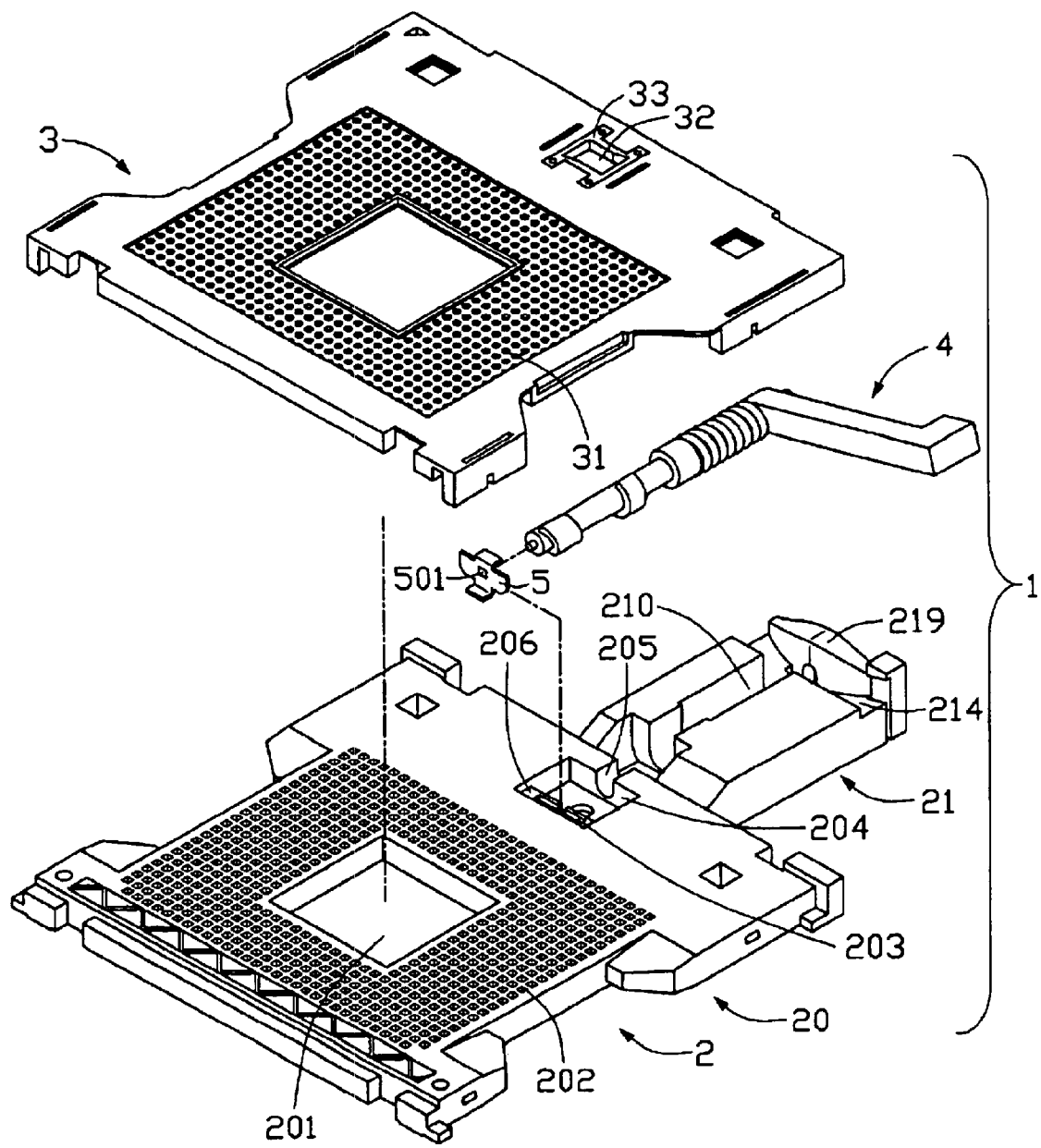
FIG. 1 is an exploded, isometric view of a ZIF electrical connector in accordance with the preferred embodiment of the present invention, wherein the connector comprises an insulative base, a cover and an actuation member.

The present invention provides a zero insertion force (ZIF) electrical connector for electrically connecting an electronic package such as a central processing unit (CPU) with a circuit substrate such as a printed circuit board (PCB). As shown in FIG. 1, the connector 1 comprises an insulative base 2 soldered to and electrically connected with the PCB (not shown), a cover 3 movably mounted onto the base 2 for attaching the CPU (not shown) thereon, and an actuation member 4 assembled between the base 2 and the cover 3 to move the cover 3 with respect to the base 2.

The base 2 comprises a body portion 20, and a head portion 21 extending from a middle portion of an end of the body portion 20. The body portion 20 defines a generally rectangular window 201 in a middle portion thereof. A multiplicity of passageways 202 is defined in the body portion 20, the passageways 202 arranged in a rectangular array around the window 201. Each passageway 202 receives an electrical contact (not shown) in a side thereof, and forming a receiving space in opposite side thereof adjacent the contact. A rectangular cavity 204 is defined in a middle of a portion of the body portion 20, the portion between the passageways 202 and the end of the body portion 20. A protrusion 206 extends from the body portion 20 in the cavity 204. An aperture 203 is defined in the protrusion 206, and communicates with the cavity 204. A metal clip 5 is accommodated in the aperture 203. A bore 501 is defined in a middle of the clip 5, and communicates with the cavity 204. A semicircular recess 205 is defined in the middle of the end of the body portion 20, the recess 205 in communication with the cavity 204.

The cover 3 has a shape similar to the body portion 20 of the base 2. A multiplicity of passages 31 is defined in the cover 3, corresponding to the passageways 202 of the base 2. A metal frame 33 is embedded in a middle portion of an end of the cover 3. An opening 32 is defined in a middle of the frame 33, corresponding to the cavity 204 of the base 2.

Figure 2:
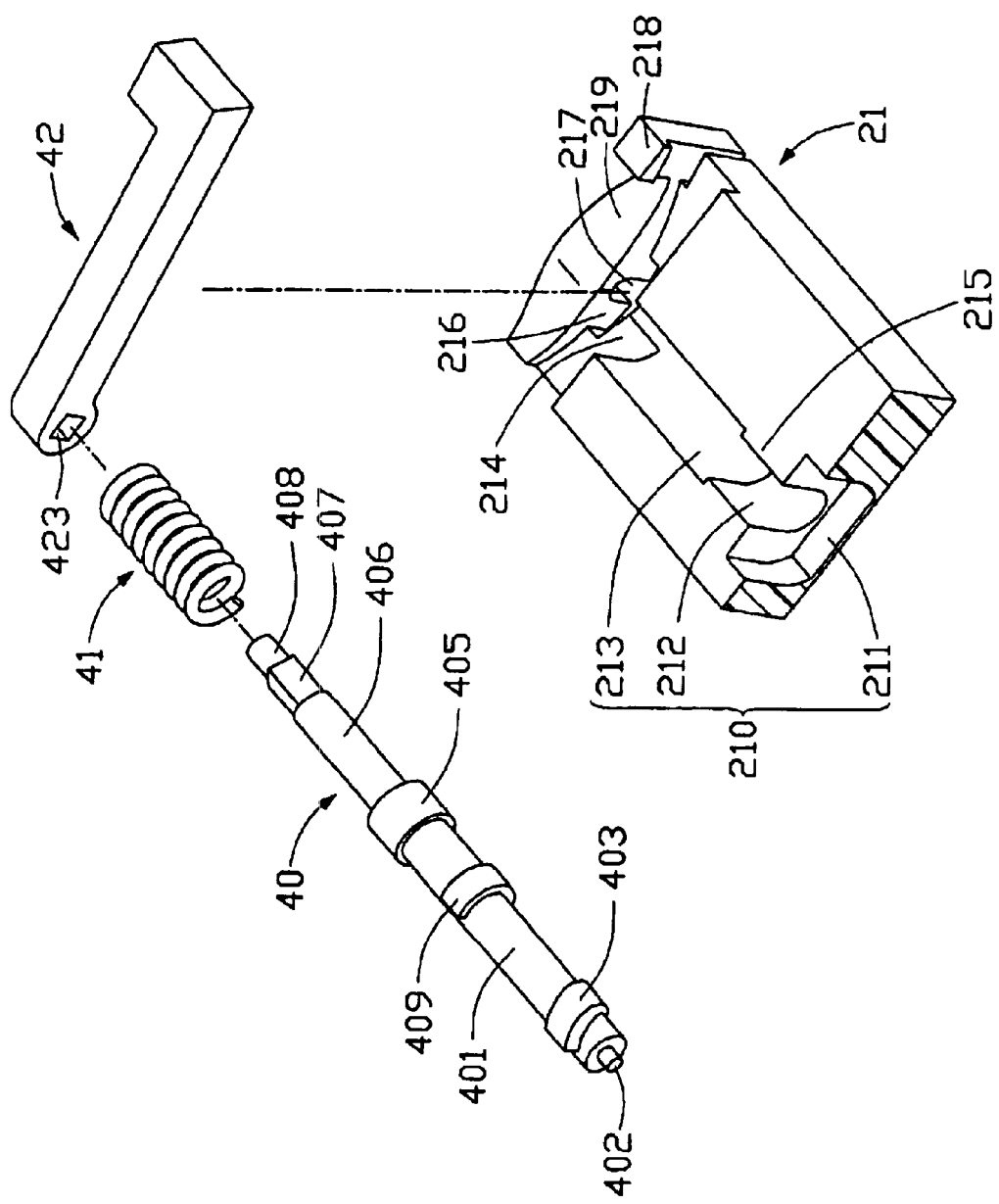
FIG. 2 is an enlarged, exploded, cross-sectional view of the actuation member and a part of the base.

A width of the head portion 21 is substantially one third of a width of the body portion 20. The head portion 21 defines a T-shaped chamber (not labeled), and a baffle 219 at a distal end thereof. The chamber comprises a shaft-receiving slot 210 extending in a longitudinal direction of the head portion 21, and a lever-receiving slot 214 perpendicular to the shaft-receiving slot 210. Referring to FIG. 2, there is shown an enlarged view of part of the head portion 21. A step 215 is formed on the head portion 21 in the shaft-receiving slot 210, thereby dividing the shaft-receiving slot 210 into a first room 211, a second room 212 and a third room 213. The lever-receiving slot 214 is disposed in an end of the head portion 21 adjacent the baffle 219. The baffle 219 has an arcuate surface 216 facing the lever-receiving slot 214. A hole 217 is defined in a middle of the baffle 219, in alignment with the shaft-receiving slot 210. A hook 218 is formed at a side of the baffle 219.

Figure 3:
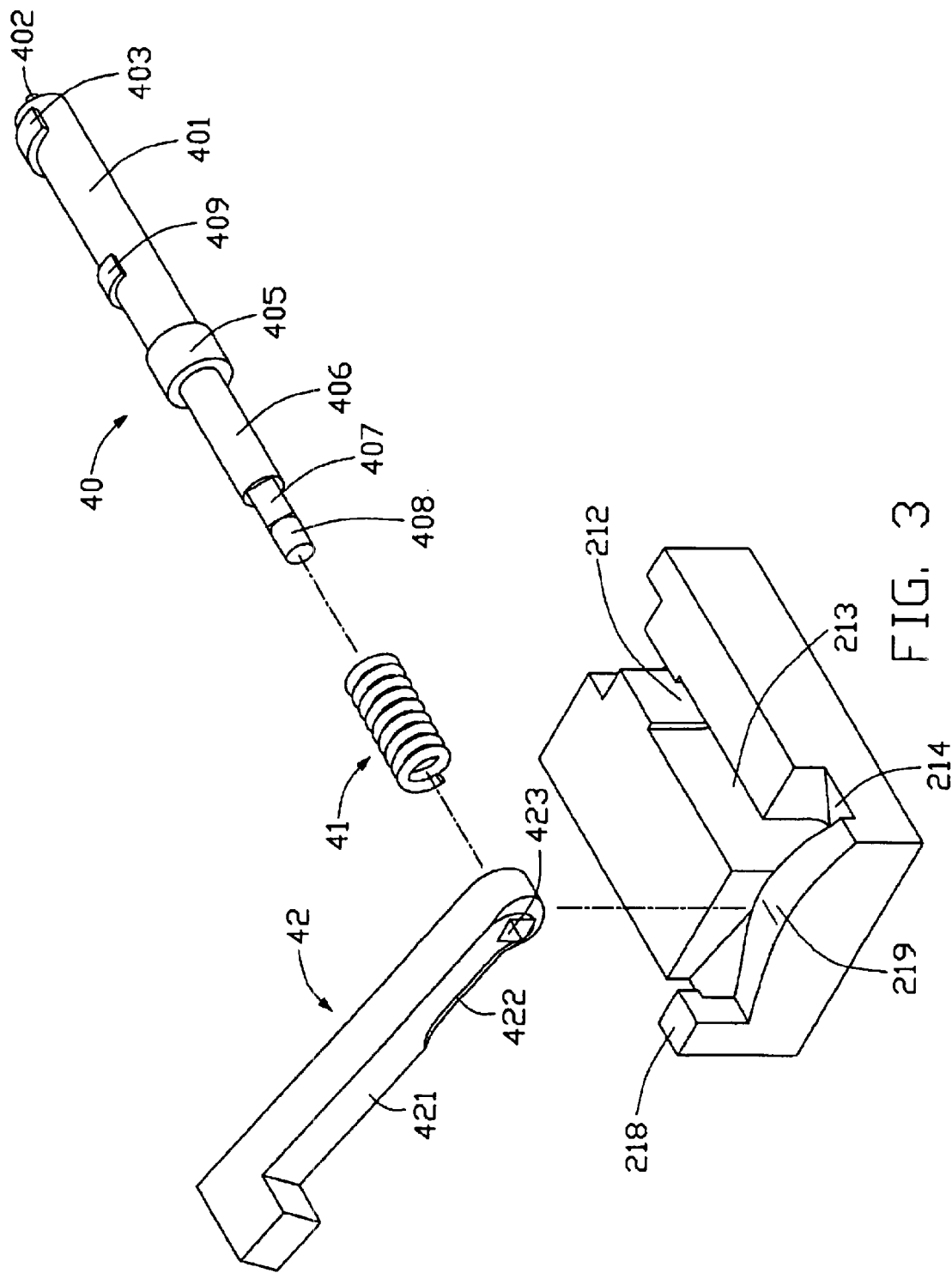
FIG. 3 is similar to FIG. 2, but viewed from another aspect.

Also referring to FIG. 3, the actuation member 4 comprises a driving shaft 40, a coil spring 41 attached around an end of the driving shaft 40, and an L-shaped operating lever 42. The driving shaft 40 comprises a first pole 401, a pin 402 coaxially extending from an end of the first pole 401, a second pole 406 coaxially extending from a distal end of the first pole 401, a cubic third pole 407 coaxially extending from a distal end of the second pole 406, a fourth pole 408 coaxially extending from a distal end of the third pole 407. A cam 403 is formed partly around the end of the first pole 401. A semicircular projecting member 409 is formed partly around a middle portion of the first pole 401. A block 405 is formed around the distal end of the first pole 401.

The operating lever 42 has a generally rectangular profile, having a rear surface 421 facing the baffle 219. A generally rectangular hollow 423 is defined in an end of the operating lever 42. A cutout (not labeled) is defined in the rear surface 421 and a surface adjacent the rear surface 421, thereby an engaging surface 422 formed between the rear surface 421 and the adjacent surface. The engaging surface 422 extends from a middle of the operating lever 42 to the end of the operating lever 42.

In assembly, the coil spring 41 is firstly assembled around the second pole 406. The operating lever 42 is assembled on the driving shaft 40, with the third pole 407 engaging movably in the hollow 423 of the operating lever 42. The fourth pole 408 of the actuation member 4 is inserted into the hole 217 of the base 2. The end of the operating lever 42 is pushed toward the second pole 406 of the driving shaft 40, and the coil spring 41 being compressed. And then the pin 402 of the actuation member 4 is inserted into the bore 501 of the clip 5. Thus, the actuation member 4 is assembled onto the base 2, with the cam 403 in the cavity 204, the projecting member 409 in the first room 211, a portion of the first pole 401 between the projecting member 409 and the block 405 in the second room 212, the block 405 and the second pole 406 in the third room 213. An edge of the block 405 abuts against the top 215 of the base 2, and an opposite end of the block 405 abuts against an end of the coil spring 41. The end of the coil spring 41 is thus positioned, and an opposite end of the coil spring 41 abuts against the end of the operating lever 42. Then, the cover 3 is assembled onto the base 2, with the cam 403 engagingly in the opening 32 of the cover 3.

Figure 4:
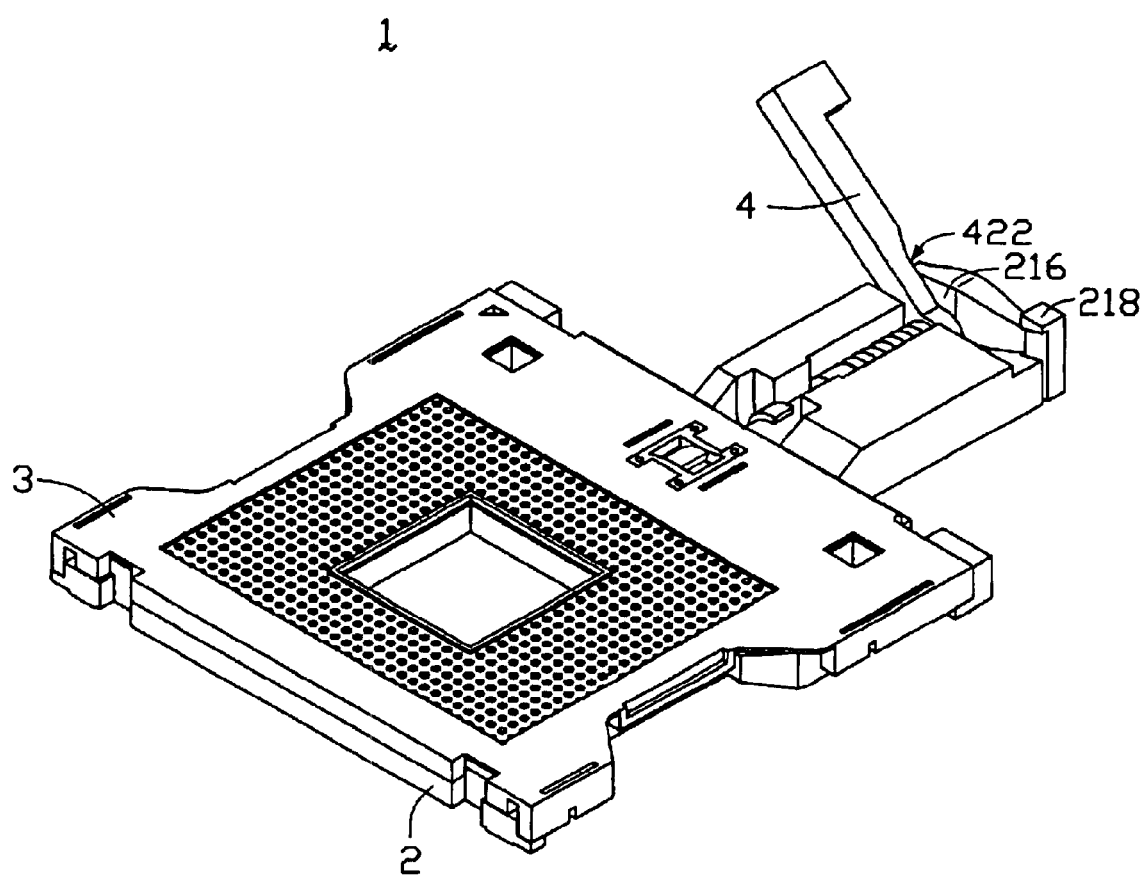
FIG. 4 is an assembled view of the connector of FIG. 1, showing the actuation member oriented at a first position.
Figure 5:
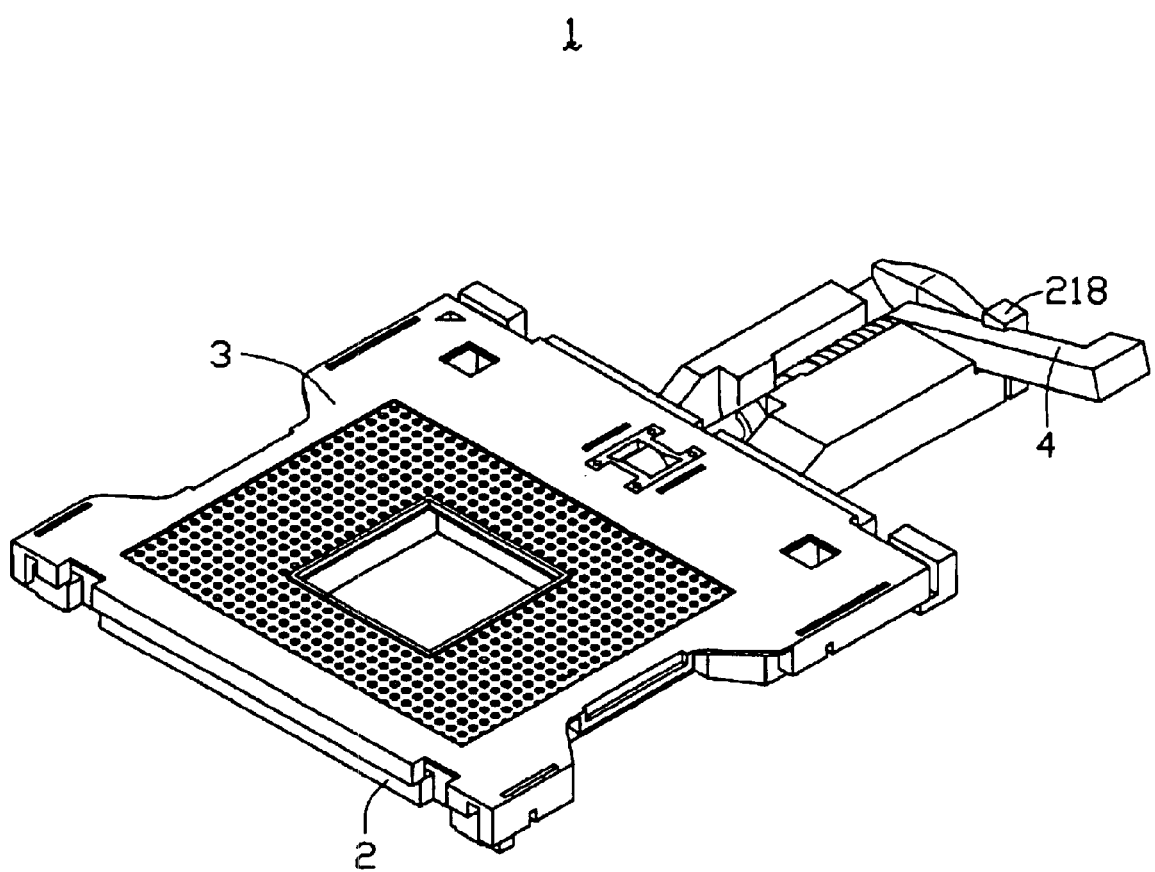
FIG. 5 is similar to FIG. 3, but showing the actuation member oriented at a second position.

Referring to FIGS. 4 and 5, in use, the operating lever 42 is pushed from a first position to a second position, thereby driving the driving shaft 40 to rotate. When the operating lever 42 is oriented at a first position, the passages 31 of the cover 3 are located over corresponding receiving spaces of the base 2. Pins (not shown) of the CPU can be inserted through the passages 31 of the cover 3 into the receiving spaces of the base 2 with ZIF. Then the operating lever 42 is pushed to the second position. Edges of the cam 403 engage with inner edges of the frame 33 of the cover 3 to move the cover 3 with respect to the base 2. The cover 3 pushes the pins of the CPU from corresponding receiving space into corresponding contacts. The hook 218 of the base 2 catches the operating lever 42, thereby positioning the operating lever 42 at the second position. The connector 1 thus connects electrically the CPU with the PCB.

In above-mentioned operation of the operating lever 42, the coil spring 41 exerts a force in an axis of the driving shaft 40 on the end of the operating lever 42, therefore, the operating lever 42 abuts against the arcuate surface 216 of the baffle 219. When the operating lever 42 is rotated from the second position to the middle of the baffle 219, the rear surface 421 of the operating lever 42 abuts against the arcuate surface 216. In this process, the coil spring 41 is compressed all the time. When the operating lever 42 is continued to be rotated towards the first position, the engaging surface 422 abuts against the arcuate surface 216 of the baffle 219. The coil spring 41 is released gradually, and providing a force through the arcuate surface 216 for the operating lever 42. The force assists in driving the operating lever 42 to rotate the first position. Therefore, when rotating from the middle portion of the baffle 219 toward the first position, the operating lever 42 can automatically rotate to the first position under compression of the coil spring 41, even if a force providing by an operator is insufficient. Consequently, the pins of the CPU are unlikely to interfere with the contacts of the connector 1, the CPU can reliably be assembled/detached onto/from the connector 1 with ZIF.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered as illustrative only. Various changes and modifications may be made in detail, especially in matters of size, shape and arrangements of parts, without departing from the spirit and scope of the invention as defined by the appended claims.

What is claimed is:

1. A zero insertion force (ZIF) electrical connector comprising:
    a base defining a plurality of passageways therethrough, a chamber in an end thereof, and a baffle at the end adjacent the chamber, the baffle defining an arcuate surface facing the chamber;
    a cover defining a plurality of passages therethrough corresponding to the passageways of the base, and an opening in an end thereof; and
    an actuation member located between the cover and the base, the actuation member comprising:
        a driving shaft located in the chamber of the base, the driving shaft having a cam at an opposite end thereof, the cam engaging in the opening of the cover;
        a coil spring attached around an end of the driving shaft; and
        an operating lever engaging the end of the driving shaft, the operating lever having a cutout to form an engaging surface;
        wherein an end of the coil spring securely engages the driving shaft and an opposite end of the coil spring abuts against an end of the operating lever;
    when the engaging surface of the operating lever abuts against the arcuate surface of the base, the operating lever can automatically rotate to a desired position by the coil spring.

2. The ZIF electrical connector as claimed in claim 1, wherein the base forms a hook at a lateral side of the baffle thereof, the hook securely engaging with the operating lever.

3. The ZIF electrical connector as claimed in claim 1, wherein the driving shaft has a block, the end of the coil spring abutting against an edge of the block.

4. The ZIF electrical connector as claimed in claim 3, wherein a step is formed in the chamber of the base for engaging with the block of the actuation member.

5. The ZIF electrical connector as claimed in claim 1, wherein the operating lever defines a generally rectangular hollow in the end thereof, and the driving shaft forms a generally rectangular cross-sectional pole engaging in the hollow of the operating lever.

6. The ZIF electrical connector as claimed in claim 1, wherein a hole is defined in a middle portion of the baffle of the base, and a pole is formed at the end of the driving shaft and engages in the hole of the base.

7. The ZIF electrical connector as claimed in claim 1, wherein a metal frame is embedded in the end of the cover, and the opening is defined in a middle portion of the frame.

8. The ZIF electrical connector as claimed in claim 7, wherein a generally rectangular cavity is defined in the base, the cavity in communication with the opening of the cover when the cover attached onto the base.

9. The ZIF electrical connector as claimed in claim 8, wherein a protrusion extends from the base in the cavity, and an aperture is defined in the protrusion in communication with the cavity.

10. The ZIF electrical connector as claimed in claim 9, wherein a metal clip is accommodated in the aperture, and a bore is defined in a middle of the clip.

11. The ZIF electrical connector as claimed in claim 10, wherein a pin extends from the opposite end of the driving shaft, the pin engaging in the bore of the clip.

12. A ZIF electrical connector comprising:
    a base with a plurality of contacts therein;
    a cover mounted on the base and slidable relative to the base in a front-to-back direction;
    an actuation member including:
    a driving shaft having means for actuating said cover to move along said front-to-back direction, an operation lever connected to said driving shaft; and
    a spring provided around said actuation member; wherein due to structural engagement between the actuation member and the base, said spring is deformed once the operation lever is moved in a halfway from a locking position to an unlocking position of said actuation member so as to tend to resume itself to urge the actuation member toward said unlocking position completely.

13. The connector as claimed in claim 12, wherein said driving shaft extends along said front-to-back direction.

* * * * *